United States Patent
Mercier (10) Patent No.: US 10,178,724 B2
(45) Date of Patent: Jan. 8, 2019

(54) OPTOELECTRONIC CIRCUIT HAVING LIGHT-EMITTING DIODES

(71) Applicant: Aledia, Grenoble (FR)

(72) Inventor: Frédéric Mercier, Saint Nicolas de Macherin (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/321,810

(22) PCT Filed: Jun. 30, 2015

(86) PCT No.: PCT/EP2015/064799
§ 371 (c)(1),
(2) Date: Dec. 23, 2016

(87) PCT Pub. No.: WO2016/001201
PCT Pub. Date: Jan. 7, 2016

(65) Prior Publication Data
US 2017/0156182 A1 Jun. 1, 2017

(30) Foreign Application Priority Data
Jun. 30, 2014 (FR) ...................................... 14 56180

(51) Int. Cl.
*H05B 33/08* (2006.01)
*H01L 25/075* (2006.01)
(Continued)

(52) U.S. Cl.
CPC ....... *H05B 33/083* (2013.01); *H01L 25/0753* (2013.01); *H01L 33/24* (2013.01);
(Continued)

(58) Field of Classification Search
None
See application file for complete search history.

(56) References Cited

U.S. PATENT DOCUMENTS

2007/0013321 A1* 1/2007 Ito .................. H05B 33/0815
315/247
2009/0079355 A1* 3/2009 Zhou ................ H05B 33/0818
315/246
(Continued)

FOREIGN PATENT DOCUMENTS

EP 2 670 217 A1 12/2013

OTHER PUBLICATIONS

PCT/EP2015/064799, Jan. 3, 2017, Written Opinion of the International Searching Authority.
(Continued)

*Primary Examiner* — Crystal L Hammond
(74) *Attorney, Agent, or Firm* — Wolf, Greenfield & Sacks, P.C.

(57) ABSTRACT

An optoelectronic circuit receiving a variable voltage containing alternating ascending and descending phases, which circuit comprises sets of light-emitting diodes mounted in series, a module for each set for comparing the voltage at one of the terminals of the set with at least a first threshold and a control module which is connected to the comparison modules and is suitable, during each ascending phase, for interrupting the flow of a current in each set when said voltage of said set goes above the second threshold or when said voltage of the set which is adjacent to said set and through which current passes goes above the first threshold and is suitable, during each descending phase, for controlling the flow of a current in each set when said voltage of the set which is adjacent to said set and through which current passes goes below the first threshold.

10 Claims, 6 Drawing Sheets

(51) Int. Cl.
*H01L 33/24* (2010.01)
*H01L 33/28* (2010.01)
*H01L 33/32* (2010.01)
*H01L 33/62* (2010.01)

(52) U.S. Cl.
CPC .............. *H01L 33/28* (2013.01); *H01L 33/32* (2013.01); *H01L 33/62* (2013.01); *H05B 33/0815* (2013.01); *H05B 33/0842* (2013.01)

(56) References Cited

U.S. PATENT DOCUMENTS

| | | | |
|---|---|---|---|
| 2010/0194298 A1 | 8/2010 | Kuwabara | |
| 2010/0308738 A1* | 12/2010 | Shteynberg | H05B 33/0812 315/185 R |
| 2013/0112945 A1* | 5/2013 | Gilet | H01L 33/06 257/13 |
| 2013/0127354 A1* | 5/2013 | Chiang | H02M 7/06 315/193 |
| 2013/0313583 A1* | 11/2013 | Hwang | H01L 33/08 257/88 |
| 2014/0184078 A1* | 7/2014 | Hwang | H05B 33/083 315/122 |
| 2015/0061499 A1* | 3/2015 | Hattrup | H05B 33/0815 315/122 |
| 2015/0108909 A1* | 4/2015 | Rupp | H05B 33/083 315/188 |

OTHER PUBLICATIONS

International Search Report for Application No. PCT/EP2015/064799 dated Oct. 6, 2015.
Written Opinion of the International Searching Authority for Application No. PCT/EP2015/064799 dated Jan. 3, 2017.

* cited by examiner

OPTOELECTRONIC CIRCUIT HAVING LIGHT-EMITTING DIODES

CROSS-REFERENCE TO RELATED APPLICATIONS

This application is the national phase of International Application No. PCT/EP2015/064799, filed on Jun. 30, 2015, which claims priority to French Application No. 14/56180, filed on Jun. 30, 2014, which applications are hereby incorporated by reference to the maximum extent allowable by law.

BACKGROUND

The present description relates to an optoelectronic circuit, particularly to an optoelectronic circuit comprising light-emitting diodes.

DISCUSSION OF THE RELATED ART

It is desirable to be able to power an optoelectronic circuit comprising light-emitting diodes with an AC voltage, particularly a sinusoidal voltage, for example, the mains voltage.

Figure 1:
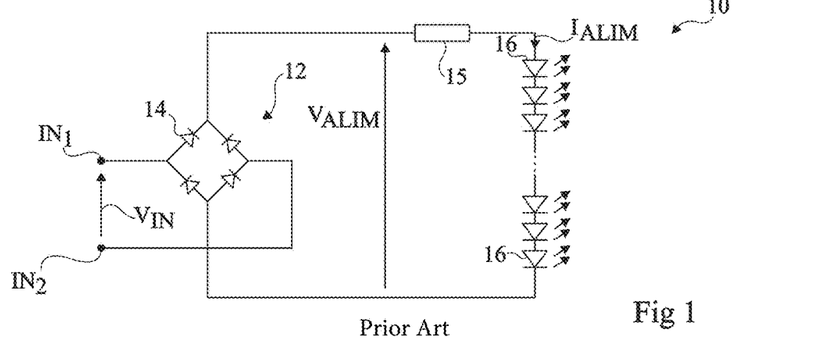
FIG. 1, previously described, is an electric diagram of an example of an optoelectronic circuit comprising light-emitting diodes.

FIG. 1 shows an example of an optoelectronic circuit 10 comprising input terminals $IN_1$ and $IN_2$ having an AC voltage $V_{IN}$ applied therebetween. Optoelectronic circuit 10 further comprises a rectifying circuit 12 comprising a diode bridge 14, receiving voltage $V_{IN}$ and supplying a rectified voltage $V_{ALIM}$ which powers light-emitting diodes 16, for example, series-assembled with a resistor 15. Call $I_{ALIM}$ the current flowing through light-emitting diodes 16.

Figure 2:
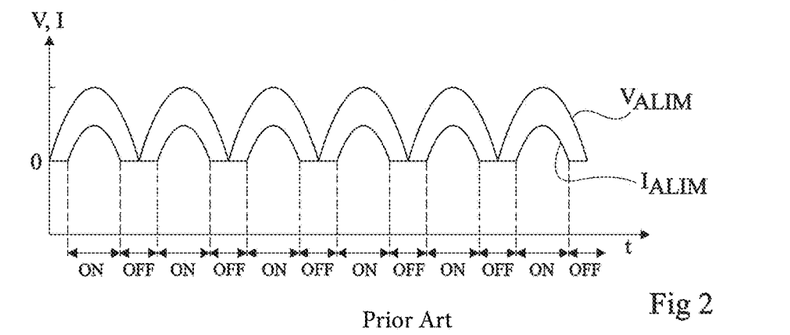
FIG. 2, previously described, is a timing diagram of the power supply voltage and current of the light-emitting diodes of the optoelectronic circuit of FIG. 1.

FIG. 2 is a timing diagram of power supply voltage $V_{ALIM}$ and of power supply current $I_{ALIM}$ for an example where AC voltage $V_{IN}$ corresponds to a sinusoidal voltage. When voltage $V_{ALIM}$ is greater than the sum of the threshold voltages of light-emitting diodes 16, light-emitting diodes 16 become conductive. Power supply current $I_{ALIM}$ then follows power supply voltage $V_{ALIM}$. There thus is an alternation of phases OFF with no light emission and of light-emission phases ON.

A disadvantage is that as long as voltage $V_{ALIM}$ is smaller than the sum of the threshold voltages of light-emitting diodes 16, no light is emitted by optoelectronic circuit 10. An observer may perceive this lack of light emission when the duration of each phase OFF with no light emission between two light-emission phases ON is too long. A possibility, to increase the duration of each phase ON, is to decrease the number of light-emitting diodes 16. A disadvantage then is that the electric power lost in the resistor is significant.

Publication U.S. 2012/0056559 describes an optoelectronic circuit where the number of light-emitting diodes receiving power supply voltage $V_{ALIM}$ progressively increases during a rising phase of the power supply voltage and progressively decreases during a falling phase of the power supply voltage. This is achieved by a switching circuit capable of short-circuiting a variable number of light-emitting diodes according to the variation of voltage $V_{ALIM}$. This enables to decrease the duration of each phase with no light emission.

A disadvantage of the optoelectronic circuit described in publication U.S. 2012/0056559 is that the light-emitting diode power supply current does not continuously vary, that is, there are abrupt interruptions of the current flow during the voltage variation. This causes time variations of the light intensity supplied by the light-emitting diodes, which may be perceived by an observer. This further causes a degradation of the harmonic factor of the current powering the light-emitting diodes of the optoelectronic circuit.

A current-limiting circuit may be interposed between the rectifying circuit and the light-emitting diodes to keep the power supply current at a substantially constant level. The structure of the optoelectronic circuit may then be relatively complex and the bulk of the optoelectronic circuit may be significant. Further, it may be difficult to at least partly form the rectifying circuit and the current-limiting circuit in integrated fashion with the light-emitting diodes in order to still further decrease the bulk of the optoelectronic circuit.

SUMMARY

An object of an embodiment is to overcome all or part of the disadvantages of the previously-described optoelectronic circuits.

Another object of an embodiment is to decrease the duration of phases with no light emission by the optoelectronic circuit.

Another object of an embodiment is for the current powering the light-emitting diodes to substantially continuously vary.

Another object of an embodiment is to decrease the bulk of the optoelectronic circuit.

Thus, an embodiment provides an optoelectronic circuit intended to receive a variable voltage containing an alternation of increasing and falling phases, the optoelectronic circuit comprising:

a plurality of assemblies of light-emitting diodes, said assemblies being series-assembled;

for each assembly, a comparison unit capable of comparing the voltage at one of the terminals of the assembly, and/or a voltage depending on said voltage at one of the terminals of the assembly, with at least a first threshold and possibly with a second threshold; and a control unit connected to the comparison units and capable, during each rising phase, of interrupting the flowing of a current in each assembly from among certain assemblies of the plurality of assemblies when said voltage of said assembly rises above the second threshold or when said voltage of the assembly, adjacent to said assembly and conducting the current, rises above the first threshold and, during each falling phase, of controlling the flowing of a current in each assembly from among certain assemblies of the plurality of assemblies when said voltage of the assembly, adjacent to said assembly and conducting the current, decreases below the first threshold.

According to an embodiment, the optoelectronic circuit comprises:

a current source;

for each assembly, a switch connecting the current source to said terminal of said assembly, and the control unit is capable, for each assembly from among certain assemblies of the plurality of assemblies, of ordering the turning-on of the switch associated with said assembly when said voltage of the assembly, adjacent to said assembly and conducting the current, decreases below the first threshold in each falling phase.

According to an embodiment, the control unit is capable, for each assembly from among certain assemblies of the plurality of assemblies, of ordering the turning-on of the switch associated with said assembly when said voltage of the assembly, adjacent to said assembly and conducting the current, rises above the second threshold in each rising phase.

According to an embodiment, the control unit is capable, after the turning-on of the switch associated with said assembly, of ordering the turning-off of the switch associated with said adjacent assembly.

According to an embodiment, the control unit is capable, for each assembly from among certain assemblies of the plurality of assemblies, of ordering the turning-off of the switch associated with said assembly when said voltage of the assembly, adjacent to said assembly, rises above the first threshold in each rising phase.

According to an embodiment, the optoelectronic circuit comprises, for each assembly, a current source, the control unit being capable, for each assembly, of ordering the activation of the current source associated with said assembly when said voltage of the assembly, adjacent to said assembly and conducting the current, rises above the second threshold in each rising phase and decreases below the first threshold in each falling phase.

According to an embodiment, the control unit is further capable, after the activation of the current source associated with said assembly, of ordering the deactivation of the current source associated with said adjacent assembly.

According to an embodiment, the optoelectronic circuit further comprises a fullwave rectifying circuit capable of supplying said voltage.

According to an embodiment, at least one of the light-emitting diodes is a planar light-emitting diode comprising a stack of layers resting on a planar surface, having at least one active layer capable of emitting light.

According to an embodiment, the light-emitting diodes of at least one of the assemblies of light-emitting diodes comprise three-dimensional semiconductor elements in the form of microwires, of nanowires, or of pyramids, each semiconductor element being covered with an active layer capable of emitting light.

According to an embodiment, the optoelectronic circuit comprises a first integrated circuit comprising the control unit and at least one second integrated circuit, distinct from the first integrated circuit and attached to the first integrated circuit, and comprising at least one of the assemblies of light-emitting diodes.

According to an embodiment, the second integrated circuit comprises all the assemblies of light-emitting diodes.

According to an embodiment, the optoelectronic circuit further comprises a third integrated circuit, distinct from the first integrated circuit and from the second integrated circuit and attached to the first integrated circuit, and comprising at least one of the assemblies of light-emitting diodes.

An embodiment also aims at a method of controlling a plurality of assemblies of light-emitting diodes, said assemblies being series-assembled and powered with a variable voltage, containing an alternation of rising and falling phases, the method comprising:

for each assembly, comparing the voltage at one of the terminals of the assembly, and/or a voltage depending on said voltage at one of the terminals of the assembly, with at least a first threshold and possibly with a second threshold; and during each rising phase, interrupting the current flow in each assembly from among certain assemblies of the plurality of assemblies when said voltage of said assembly rises above the second threshold or when said voltage of the assembly, adjacent to said assembly and conducting the current, rises above the first threshold and, during each falling phase, controlling the flowing of a current in each assembly from among certain assemblies of the plurality of assemblies when said voltage of the assembly, adjacent to said assembly and conducting the current, decreases below the first threshold.

According to an embodiment, a current source is connected, for each assembly, to said terminal of said assembly via a switch, the method further comprising, for each assembly from among certain assemblies of the plurality of assemblies, turning on the switch associated with said assembly when said voltage of the assembly, adjacent to said assembly and conducting the current, decreases below the first threshold in each falling phase.

According to an embodiment, the method comprises, for each assembly from among certain assemblies of the plurality of assemblies, turning on the switch associated with said assembly when said voltage of the assembly, adjacent to said assembly and conducting the current, rises above the second threshold in each rising phase.

According to an embodiment, the method further comprises, after the turning on of the switch associated with said assembly, turning off the switch associated with said adjacent assembly.

According to an embodiment, the method comprises, for each assembly from among certain assemblies of the plurality of assemblies, turning off the switch associated with said assembly when said voltage of the assembly, adjacent to said assembly, rises above the first threshold in each rising phase.

According to an embodiment, for each assembly, a current source is connected to said assembly, the method comprising, for each assembly, activating the current source associated with said assembly when said voltage of the assembly, adjacent to said assembly and conducting the current, rises above the second threshold in each rising phase and decreases below the first threshold in each falling phase.

According to an embodiment, the method further comprises, after the activation of the current source associated with said assembly, deactivating the current source associated with said adjacent assembly.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, the various drawings are not to scale. In the following description, unless otherwise indicated, terms "substantially", "approximately", and "in the order of" mean "to within 10%".

Figure 3:
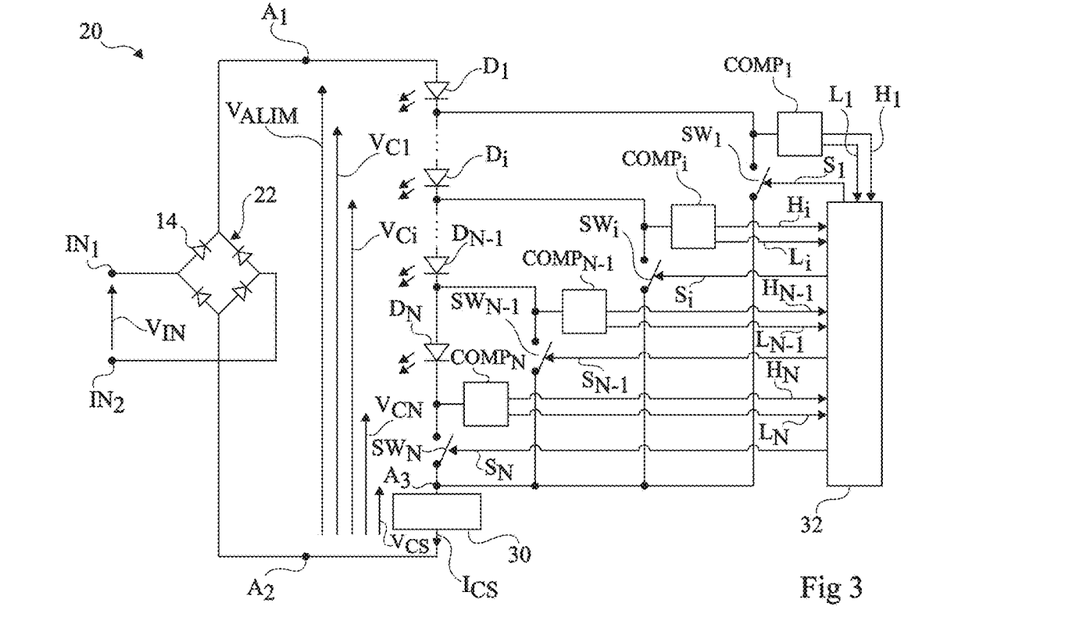
FIG. 3 shows an electric diagram of an embodiment of an optoelectronic circuit comprising light-emitting diodes.

FIG. 3 shows an electric diagram of an embodiment of an optoelectronic circuit 20 comprising two input terminals $IN_1$ and $IN_2$ receiving input voltage $V_{IN}$. As an example, input voltage $V_{IN}$ may be a sinusoidal voltage having a frequency, for example, in the range from 10 Hz to 1 MHz. Voltage $V_{IN}$ for example corresponds to the mains voltage.

Circuit 20 may comprise a fullwave rectifying circuit 22, for example comprising a diode bridge formed, for example, of four diodes 14. Rectifying circuit 22 receives power supply voltage $V_{IN}$ between terminals $IN_1$ and $IN_2$ and supplies a rectified voltage $V_{ALIM}$ between nodes $A_1$ and $A_2$. As a variation, circuit 20 may directly receive a rectified voltage, and it is then possible for the rectifying circuit not to be present.

Optoelectronic circuit 20 comprises N series-connected assemblies of elementary light-emitting diodes, called general light-emitting diodes $D_i$ in the following description, where i is an integer in the range from 1 to N and where N is an integer in the range from 2 to 200. Each general light-emitting diode $D_1$ to $D_N$ comprises at least one elementary light-emitting diode and is preferably formed of the series and/or parallel assembly of at least two elementary light-emitting diodes. In the present embodiment, the N general light-emitting diodes $D_i$ are series-connected, the cathode of general light-emitting diode $D_i$ being connected to the anode of general light-emitting diode $D_{i+1}$, for i varying from 1 to N−1. The anode of general light-emitting diode $D_1$ is connected to node $A_1$. General light-emitting diodes $D_i$, with i varying from 1 to N, may comprise the same number of elementary light-emitting diodes or different numbers of elementary light-emitting diodes.

Figure 4:
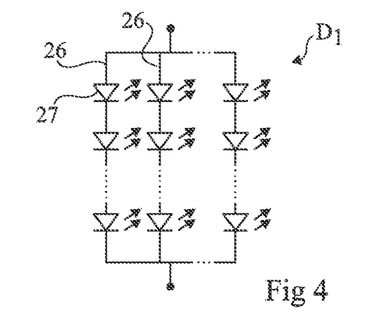
FIGS. 4 and 5 illustrate two layouts of the light-emitting diodes of the optoelectronic circuit of FIG. 3.

FIG. 4 shows an embodiment of general light-emitting diode $D_1$ where general light-emitting diode $D_1$ comprises R branches 26 assembled in parallel, each branch comprising S elementary light-emitting diodes 27 series-assembled in the same conduction direction, R and S being integers greater than or equal to 1.

Figure 5:
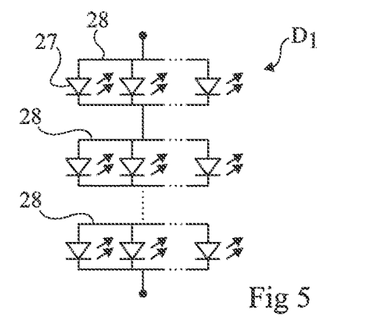

FIG. 5 shows another embodiment of general light-emitting diode $D_1$ where general light-emitting diode $D_1$ comprises P series-assembled blocks 28, each block comprising Q elementary light-emitting diodes 27 assembled in parallel, P and Q being integers greater than or equal to 1 and Q being likely to vary from one block to the other.

The other general light-emitting diodes $D_2$ to $D_N$ may have a structure similar to that of general light-emitting diode $D_1$ shown in FIG. 4 or 5.

Elementary light-emitting diodes 27 are, for example, planar light-emitting diodes, each comprising a stack of layers resting on a planar surface, having at least one active layer capable of emitting light. Elementary light-emitting diodes 27 are, for example, planar light emitting diodes, light-emitting diodes formed from three-dimensional semiconductor elements, particularly microwires, nanowires, or pyramids, for example comprising a semiconductor material based on a compound mainly comprising at least one group-III element and one group-V element (for example, gallium nitride GaN), called III-V general hereafter, or mainly comprising at least one group-II element and one group-VI element (for example, zinc oxide ZnO), called II-VI general hereafter, each three-dimensional semiconductor element is covered with an active layer capable of emitting light.

Referring to FIG. 3, optoelectronic circuit 20 comprises a current source 30 having a terminal connected to node $A_2$ and having its other terminal connected to a node $A_3$. Call $V_{CS}$ the voltage across current source 30 and $I_{CS}$ the current supplied by current source 30. Optoelectronic circuit 20 may comprise a circuit, not shown, for supplying a reference voltage to power the current source, possibly obtained from voltage $V_{ALIM}$.

Circuit 20 comprises N controllable switches $SW_1$ to $SW_N$. Each switch $SW_i$, with i varying from 1 to N, is assembled between node $A_3$ and the cathode of general light-emitting diode $D_i$. Each switch $SW_i$, with i varying from 1 to N, is controlled by a signal $S_i$. As an example, signal $S_i$ is a binary signal and switch $SW_i$ is off when signal $S_i$ is in a first state, for example, the low state, and switch $SW_i$ is on when signal $S_i$ is in a second state, for example, the high state. Call $V_{Ci}$ the voltage between the cathode of general light-emitting diode $D_i$ and node $A_2$. In the following description, unless otherwise mentioned, the voltages are referenced to node $A_2$. Switch $SW_i$ is, for example, a switch based on at least one transistor, particularly a field-effect metal-oxide gate transistor or enrichment (normally on) or depletion (normally off) MOS transistor.

Optoelectronic circuit 20 further comprises N comparison units $COMP_i$, with i varying from 1 to N, capable of each receiving voltage $V_{Ci}$ and of supplying a signal $H_i$ and a signal $L_i$. Optoelectronic circuit 20 further comprises a control unit 32 receiving signals $L_1$ to $L_N$ and $H_1$ to $H_N$ and supplying signals $S_1$ to $S_N$ for controlling switches $SW_1$ to $SW_N$. Control unit 32 preferably corresponds to a dedicated circuit.

Control unit 32 is capable of ordering the turning-on or off of switches $SW_i$, with i varying from 1 to N, according to the value of voltage $V_{Ci}$ at the cathode of each general light-emitting diode $D_i$. To achieve this, each comparison unit $COMP_i$, with i varying from 1 to N, is capable of comparing voltage $V_{Ci}$ at the cathode of general light-emitting diode $D_i$ with at least two thresholds $Vhigh_i$ and $Vlow_i$. As an example, signal $L_i$ is a binary signal which is in a first state when voltage $V_{Ci}$ is smaller than threshold $Vlow_i$ and which is in a second state when voltage $V_{Ci}$ is greater than threshold $Vlow_i$. As an example, signal $H_i$ is a binary signal which is in a first state when voltage $V_{Ci}$ is smaller than threshold $Vhigh_i$ and which is in a second state when voltage $V_{Ci}$ is greater than threshold $Vhigh_i$. The first states of binary signals $H_i$ and $L_i$ may be equal or different and the second states of binary signals $H_i$ and $L_i$ may be equal or different.

Figure 6:
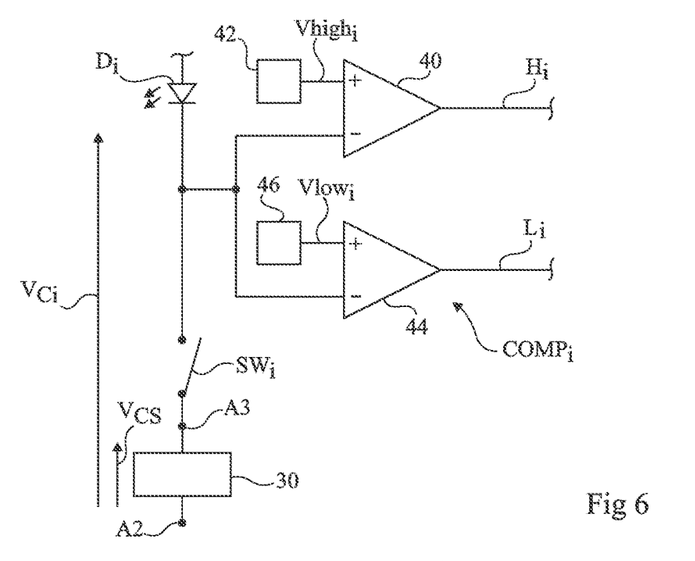
FIGS. 6 and 7 are more detailed electric diagrams of embodiments of portions of the optoelectronic circuit of FIG. 3.

FIG. 6 shows an electric diagram of a more detailed embodiment of a portion of optoelectronic circuit 20. According to the present embodiment, each comparator $COMP_i$ comprises a first operational amplifier 40, operating as a comparator, having its inverting input (−) connected to the cathode of general light-emitting diode $D_i$, and having its non-inverting input (+) receiving voltage threshold $Vhigh_i$, which is supplied by a unit 42. Comparator 40 supplies signal $H_i$. Each comparator $COMP_i$ further comprises a second operational amplifier 44, operating as a comparator, having its inverting input (−) connected to the cathode of general light-emitting diode $D_i$, and having its non-inverting input (+) receiving voltage threshold $Vlow_i$ which is supplied by a unit 46. Comparator 44 supplies signal $L_i$.

Figure 7:
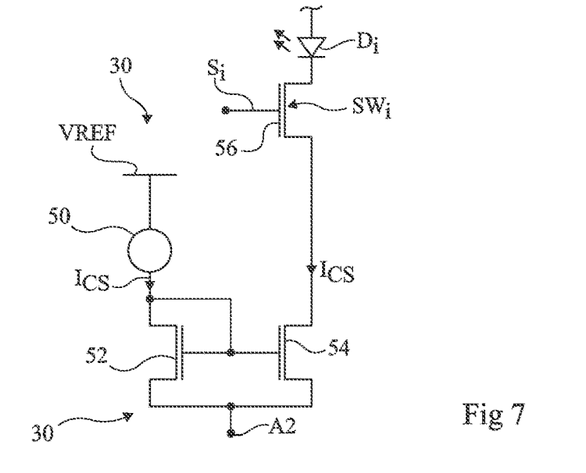

FIG. 7 shows an electric diagram of a more detailed embodiment of current source 30 and of switch $SW_i$. In the present embodiment, current source 30 comprises an ideal current source 50 having a terminal connected to a first source of a reference voltage VREF. The other terminal of current source 50 is connected to the drain of a diode-assembled N-channel MOS transistor 52. The source of MOS transistor 52 is connected to node $A_2$. The gate of MOS transistor 52 is connected to the drain of MOS transistor 52. Reference potential VREF may be supplied from voltage $V_{ALIM}$. It may be constant or vary according to voltage $V_{ALIM}$. The intensity of the current supplied by current source 30 may be constant or be variable, for example, vary according to voltage $V_{ALIM}$.

For each general light-emitting diode $D_i$, current source 30 comprises an N-channel MOS transistor 54 having its gate connected to the gate of transistor 52 and having its source connected to node $A_2$. MOS transistors 52 and 54 form a current mirror, current $I_{CS}$ supplied by current source 50 being copied, possibly with a multiplication factor.

According to the present embodiment, switch $SW_i$ comprises an N-channel MOS transistor 56 having its drain connected to the cathode of general light-emitting diode $D_i$ and having its source connected to the drain of transistor 54. The voltage applied to the gate of transistor 56 corresponds to previously-described signal $S_i$.

Figure 8:
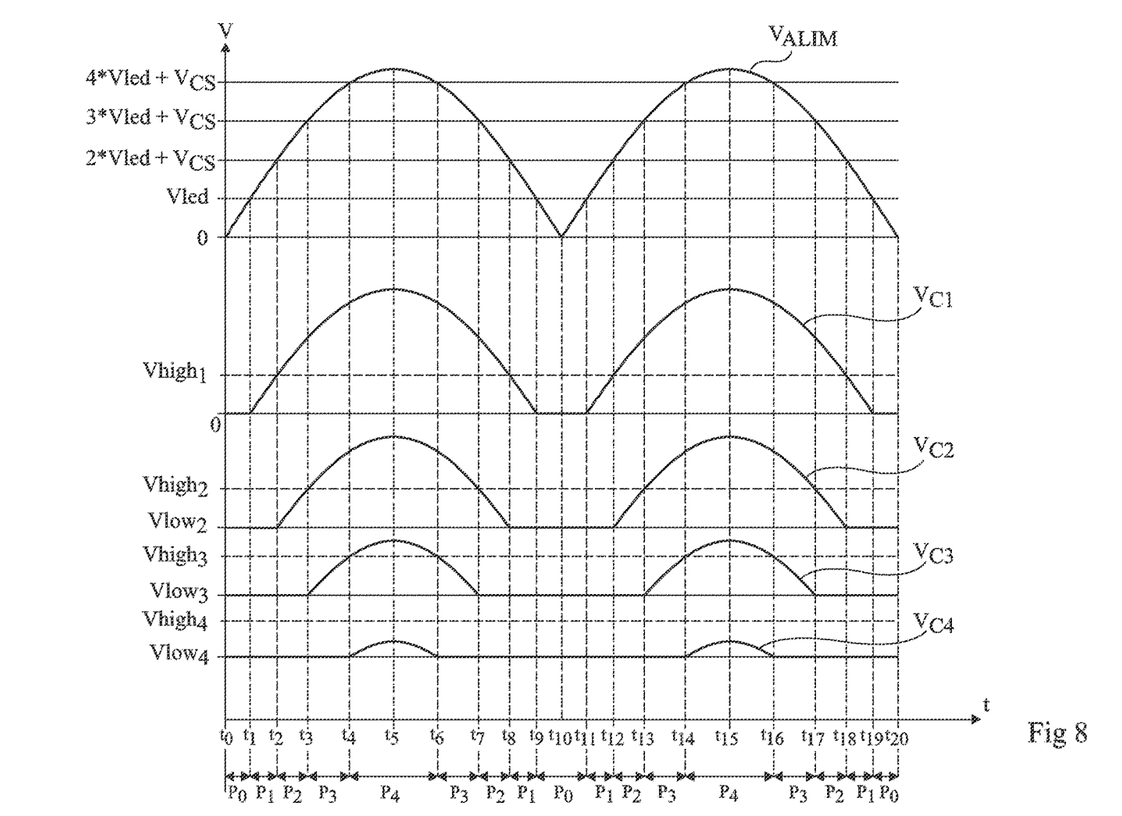
FIG. 8 is a timing diagram of voltages of the optoelectronic circuit of FIG. 3.

FIG. 8 shows timing diagrams of power supply voltage $V_{ALIM}$ and of the voltages $V_{Ci}$ measured by each comparator $COMP_i$, with i varying from 1 to N, illustrating the operation of optoelectronic circuit 20 according to the embodiment shown in FIG. 3 in the case where N is equal to 4 and in the case where each general light-emitting diode $D_i$ comprises the same number of elementary light-emitting diodes arranged in the same configuration, and thus has the same threshold voltage Vled. Call $t_0$ to $t_{20}$ successive times.

As an example, voltage $V_{ALIM}$ supplied by rectifying bridge 100 is a rectified sinusoidal voltage comprising a succession of cycles having voltage $V_{ALIM}$ increasing from the zero value, crossing a maximum value, and decreasing to the zero value, in each of them. As an example, two successive cycles of voltage $V_{ALIM}$ are shown in FIG. 8.

At time $t_0$, at the beginning of a cycle, switch $SW_1$ is turned on and all switches $SW_i$, with i varying from 2 to N, are turned off. Voltage $V_{ALIM}$ rises from the zero value and distributes between general light-emitting diode $D_1$, switch $SW_1$, and current source 30. Voltage $V_{ALIM}$ being smaller than threshold voltage Vled of general light-emitting diode $D_1$, there is no light emission (phase $P_0$) and voltage $V_{C1}$ remains substantially equal to zero.

At time $t_1$, when the voltage across general light-emitting diode $D_1$ exceeds threshold voltage Vled, general light-emitting diode $D_1$ becomes conductive (phase $P_1$). The voltage across general light-emitting diode $D_1$ then remains substantially constant and voltage $V_{C1}$ keeps on increasing along with voltage $V_{ALIM}$. As soon as power supply voltage $V_{C1}$ is sufficiently high to allow the activation of current source 30, current $I_{CS}$ flows through the general light-emitting diode $D_1$, which emits light. As an example, voltage $V_{CS}$, when current source 30 is in operation, is preferably substantially constant.

At time $t_2$, when voltage $V_{C1}$ exceeds threshold $Vhigh_1$, unit 32 successively orders the turning-on of switch $SW_2$ and then the turning-off of switch $SW_i$. Voltage $V_{ALIM}$ then distributes between general light-emitting diodes $D_1$ and $D_2$, switch $SW_2$, and current source 30. Preferably, threshold $Vhigh_1$ is substantially equal to the sum of the threshold voltage of general light-emitting diode $D_2$ and of operating voltage $V_{CS}$ of current source 30 so that, at the turning-on of switch $SW_2$, general light-emitting diode $D_2$ conducts current $I_{CS}$ and emits light. The fact for switch $SW_2$ to be turned on before the turning-off of switch $SW_i$ ensures that there will be no interruption of the current flow in general light-emitting diode $D_1$. Phase $P_2$ corresponds to a phase of light emission by general light-emitting diodes $D_1$ and $D_2$.

Generally, during a rising phase of power supply voltage $V_{ALIM}$, for i varying from 1 to N−1, while switch $SW_i$ is on and the other switches are off, unit 32 successively orders the turning-on of switch $SW_{i+1}$ and the turning-off of switch $SW_i$ when voltage $V_{Ci}$ exceeds threshold $Vhigh_i$. Voltage $V_{ALIM}$ then distributes between general light-emitting diodes $D_1$ to $D_{i+1}$, switch $SW_{i+1}$, and current source 30. Preferably, threshold $Vhigh_i$ is substantially equal to the sum of the threshold voltage of general light-emitting diode $D_{i+1}$ and of operating voltage $V_{CS}$ of current source 30 so that, at the turning-on of switch $SW_{i+1}$, general light-emitting diode $D_{i+1}$ conducts current $I_{CS}$ and emits light. Phase $P_{i+1}$ corresponds to the emission of light by general light-emitting diodes $D_1$ to $D_{i+1}$. The fact for switch $SW_{i+1}$ to be turned on before the turning-off of switch $SW_i$ ensures that there will be no interruption of the current flow in general light-emitting diodes $D_1$ to $D_i$.

Thus, at time $t_3$, unit 32 orders the turning-on of switch $SW_3$ and the turning-off of switch $SW_2$. Phase $P_3$ corresponds to the emission of light by general light-emitting diodes $D_1$, $D_2$, and $D_3$. At time $t_4$, unit 32 orders the turning-on of switch $SW_4$ and the turning-off of switch $SW_3$. Phase $P_4$ corresponds to the emission of light by general light-emitting diodes $D_1$, $D_2$, $D_3$, and $D_4$.

Power supply voltage $V_{ALIM}$ reaches its maximum value at time $t_5$ during phase $P_4$ in FIG. 8 and starts a falling phase.

At time $t_6$, when voltage $V_{C4}$ decreases below threshold $Vlow_4$, unit 32 successively orders the turning-on of switch $SW_3$ and the turning-off of switch $SW_4$. Voltage $V_{ALIM}$ then distributes between general light-emitting diodes $D_1$, $D_2$, and $D_3$, switch $SW_3$, and current source 30. Preferably, threshold $Vlow_4$ is selected to be substantially equal to the sum of operating voltage $V_{CS}$ of current source 30 and of the minimum operating voltage of switch $SW_4$ so that, at the turning-on of switch $SW_3$, there is no interruption of the current flow.

Generally, during a falling phase of power supply voltage $V_{ALIM}$, for i varying from 2 to N, when voltage $V_{Ci}$ decreases below threshold $Vlow_i$, unit 32 successively orders the turning-on of switch $SW_{i-1}$ and the turning-off of switch $SW_i$. Voltage $V_{ALIM}$ then distributes between general light-emitting diodes $D_1$ to $D_{i-1}$, switch $SW_{i-1}$, and current source 30. Preferably, threshold $Vlow_i$ is selected to be substantially equal to the sum of operating voltage $V_{CS}$ of current source 30 and of the minimum operating voltage of switch $SW_i$ so that, at the turning-on of switch $SW_{i-1}$, there is no interruption of the current flow.

Thus, at time $t_7$, unit 32 orders the turning-on of switch $SW_2$ and the turning-off of switch $SW_3$. At time $t_8$, unit 32 orders the turning-on of switch $SW_2$ and the turning-off of switch $SW_1$. At time $t_9$, voltage $V_{C1}$ becomes zero so that general light-emitting diode $D_1$ is no longer conductive and current source 30 is off. At time $t_{10}$, voltage $V_{ALIM}$ becomes zero and a new cycle starts. Times $t_{11}$ to $t_{20}$ are respectively similar to times $t_1$ to $t_{10}$. In the present embodiment, comparator $COMP_1$ may have a simpler structure than comparators $COMP_i$, with i varying from 2 to N, since threshold $Vlow_1$ is not used.

According to another embodiment of optoelectronic circuit 20, each comparator $COMP_i$ of optoelectronic circuit 20 only supplies signal $L_i$. An advantage of this embodiment is that the structure of comparator $COMP_i$ can be simplified. Indeed, it is possible for comparator $COMP_i$ not to comprise operational amplifier 40.

The operation of the optoelectronic circuit according to this other embodiment is then identical to what has been previously described, with the difference that switches $SW_i$, with i varying from 1 to N-1, are initially on and that, in a rising phase of power supply voltage $V_{ALIM}$, switch $SW_{i-1}$ is off when voltage $V_{Ci}$ is greater than threshold $Vlow_i$. Indeed, this means that current starts flowing through switch $SW_i$.

More specifically, in a rising phase of power supply voltage $V_{ALIM}$, for i varying from 1 to N-1, while light-emitting diodes $D_1$ to $D_{i-1}$ are conductive and light-emitting diodes $D_i$ to $D_N$ are blocked, when voltage $V_{Ci}$ falls below threshold $Vlow_i$, unit 32 orders the turning-off of $SW_{i-1}$. Indeed, a rise in voltage $V_{Ci}$ means that the voltage across light-emitting diode $D_i$ becomes greater than the threshold voltage of light-emitting diode $D_i$ and that the latter becomes conductive.

The operation of the optoelectronic circuit according to this other embodiment in a falling phase of power supply voltage $V_{ALIM}$ may be identical to that which has been previously described for optoelectronic circuit 20.

Figure 9:
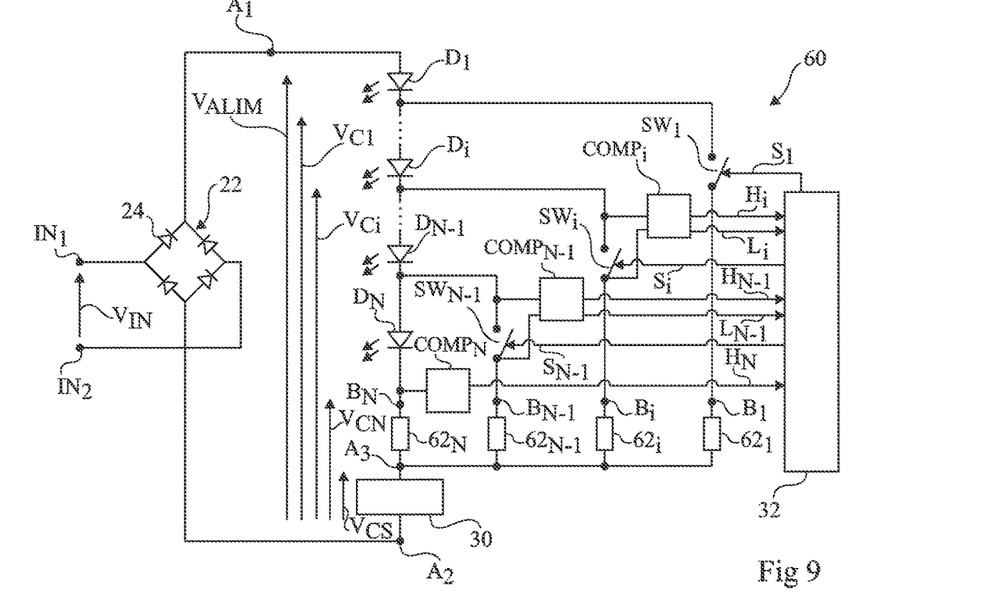
FIG. 9 shows an electric diagram of another embodiment of an optoelectronic circuit comprising light-emitting diodes.

FIG. 9 shows an electric diagram of another embodiment of an optoelectronic circuit 60. All the elements common with optoelectronic circuit 20 are designated with the same reference numerals. Unlike optoelectronic circuit 20, optoelectronic circuit 60 does not comprise switch $SW_N$. Further, unlike optoelectronic circuit 20, for i varying from 1 to N-1, optoelectronic circuit 60 comprises a resistor $62_i$ provided between node $A_3$ and switch $SW_i$, and optoelectronic circuit 60 comprises a resistor $62_N$ provided between node $A_3$ and the cathode of general light-emitting diode $D_N$. Call $B_i$ a node between resistor $62_i$ and switch $SW_i$, for i varying from 1 to N-1, and $B_N$ a node between resistor $62_N$ and the cathode of general light-emitting diode $D_N$. Further, each comparator $COMP_i$, with i varying from 1 to N, further receives the voltage at node $B_i$. Signal $H_i$ then is a binary signal which is in a first state when the voltage at node $B_i$ is smaller than a threshold $MIN_i$ and which is in a second state when the voltage at node $B_i$ is greater than threshold $MIN_i$.

Figure 10:
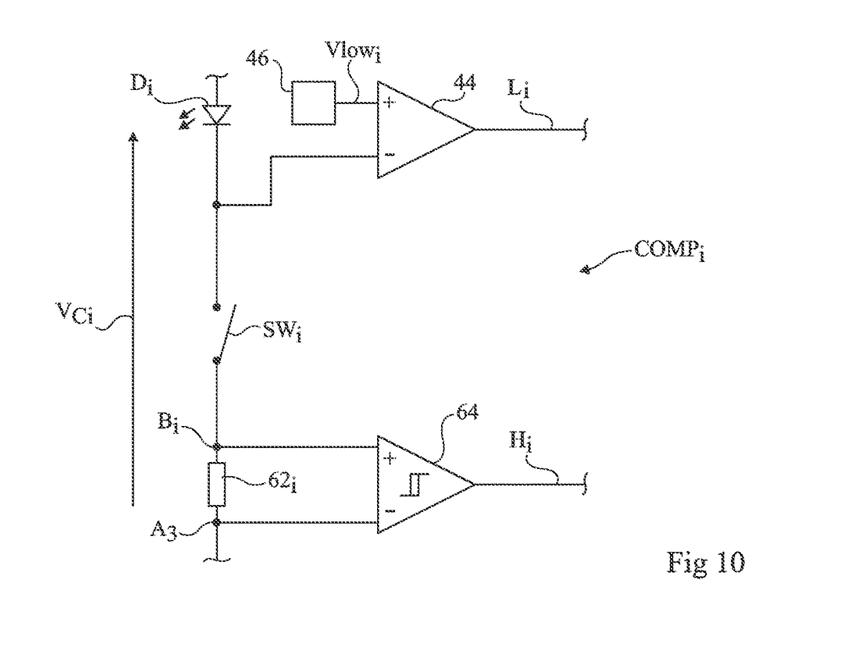
FIGS. 10 and 11 are drawings respectively similar to FIGS. 6 and 7 and show electric diagrams of more detailed embodiments of portions of the optoelectronic circuit of FIG. 9.

FIG. 10 shows an electric diagram of a more detailed embodiment of a portion of optoelectronic circuit 60. In the present embodiment, comparator $COMP_i$ comprises all the elements of comparator $COMP_i$ shown in FIG. 6 with the difference that operational amplifier 40 is replaced with a hysteresis comparator 64 receiving the voltage across resistor $62_i$ and supplying signal $H_i$.

Figure 11:
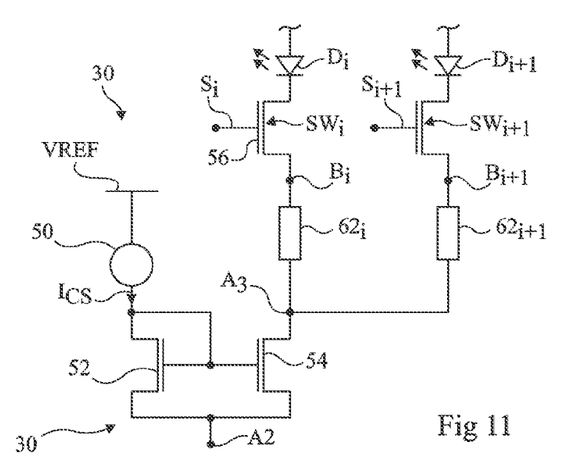

FIG. 11 shows an electric diagram of a more detailed embodiment of current source 30 and of switch $SW_i$ for optoelectronic circuit 60. Current source 30 comprises all the elements of the current source shown in FIG. 7. Resistor $62_i$ is interposed between MOS transistor 54 and node $B_i$, a terminal of resistor $62_i$ being connected to the drain of transistor 54 and the other terminal of resistor $62_i$ being connected to node $B_i$.

The operation of optoelectronic circuit 60 may be identical to the operation of previously-described optoelectronic circuit 20 with the difference that, in a rising phase of power supply voltage $V_{ALIM}$, switch $SW_i$ is turned off when current starts flowing through resistor $62_{i+1}$.

More specifically, switches $SW_i$, with i varying from 1 to N-1, are initially on. In a rising phase of power supply voltage $V_{ALIM}$, for i varying from 1 to N-1, while light-emitting diodes $D_1$ to $D_{i-1}$ are conductive and light-emitting diodes $D_i$ to $D_N$ are blocked, when the voltage across light-emitting diode $D_i$ becomes greater than the threshold voltage of light-emitting diode $D_i$, the latter becomes conductive and a current starts flowing through resistor $62_i$. This results in a rise in the voltage at node $B_i$. As soon as the voltage at node $B_i$ rises above threshold $MIN_i$, unit 32 orders the turning-on of switch $SW_{i-1}$.

The operation of optoelectronic circuit 60 in a falling phase of power supply voltage $V_{ALIM}$ may be identical to that which has been previously described for optoelectronic circuit 20.

Optoelectronic circuit 60 has the advantage that thresholds $MIN_i$ and $Vlow_i$ can be independent from the characteristics of light-emitting diodes $D_i$. In particular, they do not depend on the threshold voltage of each light-emitting diode $D_i$.

Figure 12:
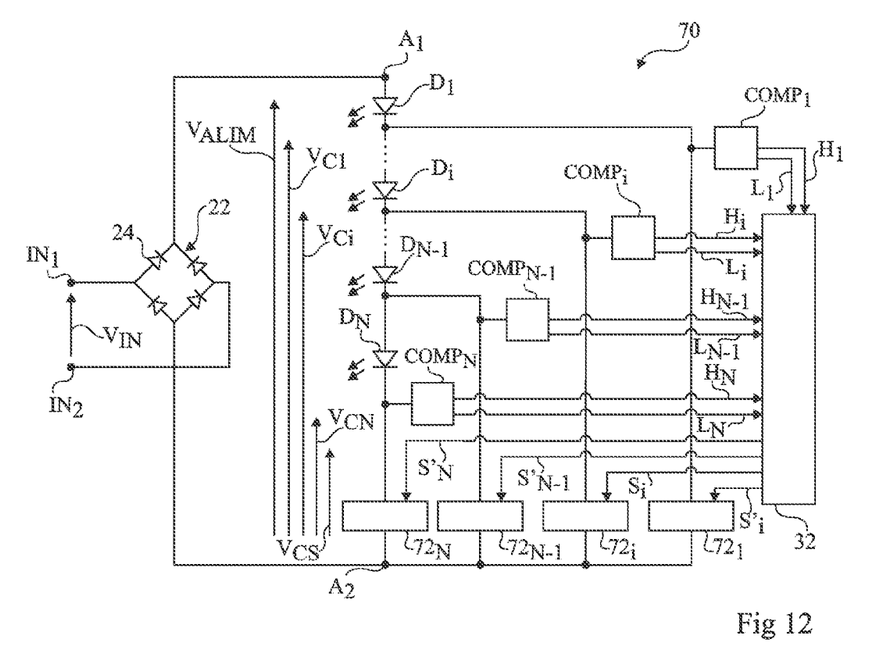
FIG. 12 shows an electric diagram of another embodiment of an optoelectronic circuit comprising light-emitting diodes.

FIG. 12 shows an electric diagram of another embodiment of an optoelectronic circuit 70. All the elements common with optoelectronic circuit 20 are designated with the same reference numerals. Optoelectronic circuit 70 comprises, for each general light-emitting diode $D_i$, a current source $72_i$, with i varying from 1 to N, associated with general light-emitting diode $D_i$. A terminal of current source $72_i$, with i varying from 1 to N, is connected to node $A_2$ and the other terminal is connected to the cathode of general light-emitting diode $D_i$.

Each current source $72_i$, with i varying from 1 to N, is controlled by a signal $S'_i$ supplied by control unit 32. As an example, signal $S'_i$ is a binary signal and current source $72_i$ is activated when signal $S'_i$ is in a first state and current source $72_i$ is deactivated when signal $S'_i$ is in a second state.

The operation of optoelectronic circuit 70 may be identical to the operation of previously-described optoelectronic circuit 20, with the difference that the steps of turning-off and turning-on of switches $SW_i$ of optoelectronic circuit 20 are respectively replaced with steps of activation and of deactivation of current sources $72_i$.

More specifically, in a rising phase of power supply voltage $V_{ALIM}$, for i varying from 1 to N-1, while current source $72_i$ is activated and the other current sources are deactivated, unit 32 successively orders the activation of current source $72_{i+1}$ and the deactivation of current source $72_i$ when voltage $V_{Ci}$ exceeds threshold $Vhigh_i$. Voltage $V_{ALIM}$ then distributes between general light-emitting diodes $D_1$ to $D_{i+1}$ and current source $72_{i+1}$. Preferably, threshold $Vhigh_i$ is selected to be substantially equal to the threshold voltage of general light-emitting diode $D_{i+1}$ so that on activation of current source $72_{i+1}$, general light-emitting diode $D_{i+1}$ conducts current $I_{CS}$ and emits light. The fact for current source $72_{i+1}$ to be activated before current source $72_i$ is deactivated ensures that there is no interruption in the current flow in general light-emitting diodes $D_1$ to $D_i$.

Generally, in a falling phase of power supply voltage $V_{ALIM}$, for i varying from 2 to N, when voltage $V_{Ci}$ decreases below threshold $Vlow_i$, unit 32 successively orders the activation of current source $72_{i-1}$ and the deactivation of current source $72_i$. Voltage $V_{ALIM}$ then distributes between general light-emitting diodes $D_1$ to $D_{i-1}$ and current source $72_{i+1}$. The fact for current source $72_{i-1}$ to be activated before current source $72_i$ is deactivated ensures that there is no interruption in the current flow in general light-emitting diodes $D_1$ to $D_{i-1}$.

Figure 13:
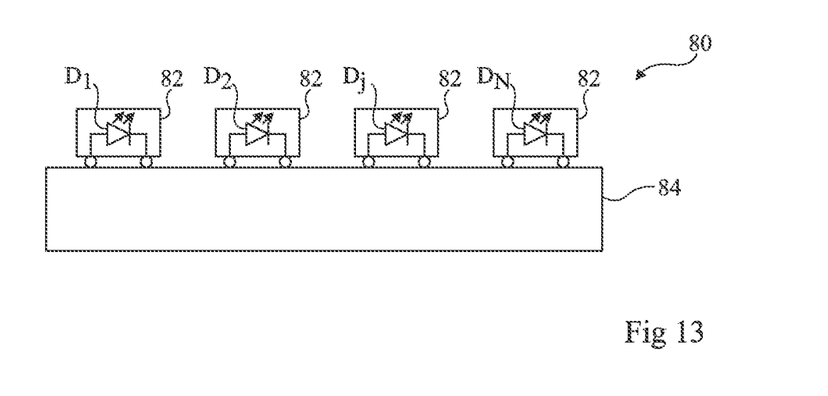
FIGS. 13 and 14 are partial simplified cross-section views of two embodiments of an optoelectronic circuit comprising light-emitting diodes.

FIG. 13 is a partial simplified cross-section view of another embodiment of an optoelectronic circuit 80 having an equivalent electric diagram which may correspond to one of the diagrams shown in FIG. 3, 9, or 12. In this embodiment, each general light-emitting diode $D_1$ to $D_N$ is formed on a different monolithic circuit 82. The other components of optoelectronic circuit 80 are formed in another integrated circuit 84. Each monolithic circuit 82 is connected to integrated circuit 84, for example, by a flip-chip-type connection. Each general light-emitting diode $D_1$ to $D_N$ may correspond to a planar light-emitting diode or to a light-emitting diode formed from three-dimensional elements, particularly semiconductor microwires or nanowires.

According to a variation, at least one of monolithic circuits 82 may comprise more than one general light-emitting diode.

Figure 14:
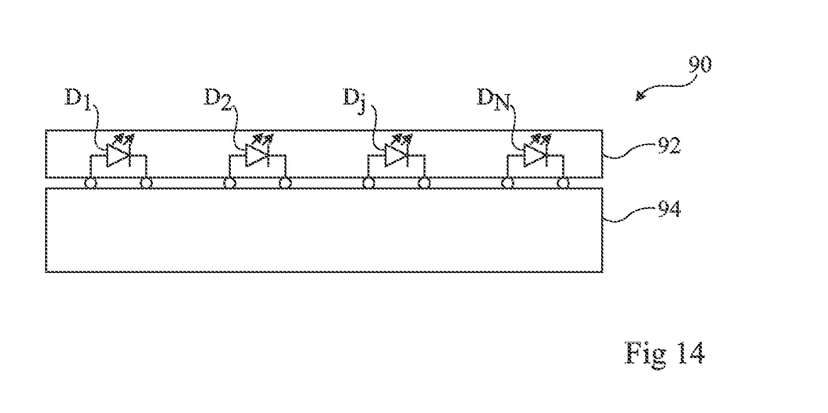

FIG. 14 is a partial simplified cross-section view of another embodiment of an optoelectronic circuit 90 having an equivalent electric diagram which may correspond to one of the diagrams shown in FIG. 3, 9, or 12. In this embodiment, general light-emitting diodes $D_1$ to $D_N$ are formed in integrated fashion on a different circuit 92. The other components of optoelectronic circuit 90 are formed in another integrated circuit 94. Integrated circuit 92 is connected to integrated circuit 94, for example, by a flip-chip-type connection. Each general light-emitting diode $D_1$ to $D_N$ may correspond to a planar light-emitting diode or to a light-emitting diode formed from three-dimensional elements, particularly semiconductor microwires or nanowires.

According to another embodiment, all the components of the optoelectronic circuit according to one of the equivalent electric diagrams shown in FIG. 3, 9, or 12 are formed on a same integrated circuit. Each general light-emitting diode $D_1$ to $D_N$ may correspond to a planar light-emitting diode or to a light-emitting diode formed from three-dimensional elements, particularly semiconductor microwires or nanowires.

According to another embodiment, each general light-emitting diode $D_1$ to $D_N$ may correspond to a discrete component, particularly comprising a light-emitting diode protection package. Each component is for example attached to a support, particularly a printed circuit, having the other components of the optoelectronic circuit attached thereto.

Various embodiments with different variations have been described hereabove. It should be noted that those skilled in the art may combine various elements of these various embodiments and variations without showing any inventive step.

The invention claimed is:

1. An optoelectronic circuit intended to receive a variable voltage containing an alternation of rising and falling phases, the optoelectronic circuit comprising:
 a plurality of assemblies of light-emitting diodes, said assemblies being series-assembled;
 for each assembly, a comparator configured to compare at least one of the voltage at one of the terminals of the assembly and a voltage depending on said voltage at one of the terminals of the assembly, with at least one of a first threshold and a second threshold;
 a current source;
 for each assembly, a switch connecting the current source to said terminal of said assembly; and a controller connected to the comparators configured to:
 during each rising phase, for each assembly from among assemblies of the plurality of assemblies, when said voltage of said assembly rises above the second threshold:
 turn on the switch of said assembly and turn off the switch of an adjacent assembly conducting the current; and
 during each falling phase, for each assembly from among assemblies of the plurality of assemblies, when said voltage of an adjacent assembly conducting the current decreases below the first threshold:
 turn off the switch of said assembly and turn on the switch of the adjacent assembly.

2. The optoelectronic circuit of claim 1, wherein the controller is configured to, after turning on the switch associated with said assembly, turn off the switch associated with said adjacent assembly.

3. The optoelectronic circuit of claim 1, further comprising a fullwave rectifying circuit configured to supply said voltage.

4. The optoelectronic circuit of claim 1, wherein at least one of the light-emitting diodes is a planar light-emitting diode comprising a stack of layers resting on a planar surface, having at least one active layer configured to emit light.

5. The optoelectronic circuit of claim 1, wherein the light-emitting diodes of at least one of the assemblies of light-emitting diodes comprise three-dimensional semiconductor elements in the form of microwires, of nanowires, or of pyramids, each semiconductor element being covered with an active layer configured to light.

6. The optoelectronic circuit of claim 1, comprising a first integrated circuit comprising the controller and at least one second integrated circuit, distinct from the first integrated circuit and attached to the first integrated circuit, and comprising at least one of the assemblies of light-emitting diodes.

7. The optoelectronic circuit of claim 6, wherein the second integrated circuit comprises all the assemblies of light-emitting diodes.

8. The optoelectronic circuit of claim 6, further comprising a third integrated circuit, distinct from the first integrated circuit and from the second integrated circuit and attached to the first integrated circuit, and comprising at least one of the assemblies of light-emitting diodes.

9. A method of controlling a plurality of assemblies of light-emitting diodes, said assemblies being series-assembled and powered with a variable voltage, containing an alternation of rising and falling phases, a current source being connected, for each assembly to said terminal of said assembly via a switch, the method comprising the steps of:
 for each assembly, comparing the voltage at one of the terminals of the assembly, and a voltage depending on said voltage at one of the terminals of the assembly, with at least one of a first threshold and a second threshold; and
 during each rising phase, for each assembly from among certain assemblies of the plurality of assemblies, when said voltage of said assembly rises above the second threshold:
 turn on the switch of said assembly and turn off the switch of an adjacent assembly conducting the current; and during each falling phase, for each assembly from among assemblies of the plurality of assemblies, when said voltage of an adjacent assembly conducting the current, decreases below the first threshold:
  turn off the switch of said assembly and turn on the switch of the adjacent assembly.

10. The method of claim 9, further comprising, after turning on the switch associated with said assembly, turning off the switch associated with said adjacent assembly.

* * * * *

UNITED STATES PATENT AND TRADEMARK OFFICE
CERTIFICATE OF CORRECTION

PATENT NO. : 10,178,724 B2
APPLICATION NO. : 15/321810
DATED : January 8, 2019
INVENTOR(S) : Frédéric Mercier Page 1 of 1

It is certified that error appears in the above-identified patent and that said Letters Patent is hereby corrected as shown below:

In the Claims

In Claim 9, at Column 12, Line 54, please delete "for each assembly to said terminal" and insert --for each assembly, to said terminal--

In Claim 9, at Column 12, Line 56, please delete "comparing the voltage" and insert --comparing at least one of the voltage--

In Claim 9, at Column 12, Line 57, please delete "of the assembly, and a voltage" and insert --of the assembly and a voltage--

In Claim 9, at Column 12, Line 62, please delete "certain assemblies of the plurality" and insert --assemblies of the plurality--

Signed and Sealed this
Twenty-sixth Day of February, 2019

Andrei Iancu
*Director of the United States Patent and Trademark Office*